(12) United States Patent
Yuan et al.

(10) Patent No.: US 10,535,302 B2
(45) Date of Patent: Jan. 14, 2020

(54) PIXEL CIRCUIT, METHOD FOR DRIVING THE SAME, AND DISPLAY APPARATUS

(71) Applicants: BOE Technology Group Co., Ltd., Beijing (CN); Hefei Xinsheng Optoelectronics Technology Co., Ltd., Anhui (CN)

(72) Inventors: Can Yuan, Beijing (CN); Yongqian Li, Beijing (CN); Zhidong Yuan, Beijing (CN); Zhenfei Cai, Beijing (CN); Meng Li, Beijing (CN); Xuehuan Feng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/975,469

(22) Filed: May 9, 2018

(65) Prior Publication Data

US 2019/0164481 A1 May 30, 2019

(30) Foreign Application Priority Data

Nov. 27, 2017 (CN) .......................... 2017 1 1213543

(51) Int. Cl.
  *G09G 3/30* (2006.01)
  *G09G 3/3233* (2016.01)
  (Continued)

(52) U.S. Cl.
  CPC ......... *G09G 3/3233* (2013.01); *G09G 3/3266* (2013.01); *G09G 3/3275* (2013.01);
  (Continued)

(58) Field of Classification Search
  CPC ..... G09G 3/30–3291; G09G 2300/0439–0895
  See application file for complete search history.

(56) References Cited

U.S. PATENT DOCUMENTS

| 7,796,102 B2 | 9/2010 | Ishizuka et al. |
| 8,022,903 B2 | 9/2011 | Yamamoto et al. |
| (Continued) | | |

FOREIGN PATENT DOCUMENTS

| CN | 1985293 A | 6/2007 |
| CN | 101339735 A | 1/2009 |
| (Continued) | | |

OTHER PUBLICATIONS

Office Action, including Search Report, for Chinese Patent Application No. 201711213543.1, dated Mar. 27, 2019, 17 pages.

*Primary Examiner* — Sanghyuk Park
(74) *Attorney, Agent, or Firm* — Westman, Champlin & Koehler, P.A.

(57) ABSTRACT

The embodiments of the present application provide a pixel circuit, a method for driving the same, and a display apparatus. A driving sub-circuit in the pixel circuit includes a driving transistor and a first storage capacitor. The first storage capacitor has a first terminal electrically coupled to a gate of the driving transistor, and a second terminal coupled to a second electrode of the driving transistor. A writing sub-circuit is coupled to a scanning signal line, a data line, and the gate of the driving transistor, and is configured to write a data voltage into the driving transistor and maintain the driving transistor to be turned on. A reset sub-circuit is configured to supply an initial voltage to the light emitting sub-circuit so as to reset the light emitting sub-circuit. The driving transistor is further coupled to the light emitting sub-circuit to drive the light emitting sub-circuit to emit light.

8 Claims, 8 Drawing Sheets

(51) Int. Cl.
　　　*H01L 27/32*　　　(2006.01)
　　　*G09G 3/3275*　　(2016.01)
　　　*G09G 3/3266*　　(2016.01)

(52) U.S. Cl.
　　　CPC ...... *H01L 27/3262* (2013.01); *H01L 27/3265* (2013.01); *H01L 27/3276* (2013.01); *G09G 2300/0861* (2013.01); *G09G 2310/0251* (2013.01); *G09G 2310/0262* (2013.01); *G09G 2320/0295* (2013.01); *G09G 2320/043* (2013.01); *G09G 2320/0693* (2013.01)

(56) References Cited

U.S. PATENT DOCUMENTS

| | | |
|---|---|---|
| 8,169,432 B2 | 5/2012 | Yamamoto et al. |
| 8,810,558 B2 | 8/2014 | Yamamoto et al. |
| 8,976,099 B2 | 3/2015 | Shah et al. |
| 2008/0143648 A1 | 6/2008 | Ishizuka et al. |
| 2009/0009441 A1 | 1/2009 | Yamamoto et al. |
| 2010/0033476 A1 | 2/2010 | Yamamoto et al. |
| 2011/0298531 A1 | 12/2011 | Shah et al. |
| 2012/0038605 A1* | 2/2012 | Han .................. H05B 33/0896 345/211 |
| 2012/0182281 A1 | 7/2012 | Yamamoto et al. |
| 2017/0141237 A1* | 5/2017 | Arae ............... H01L 21/823462 |
| 2017/0270867 A1* | 9/2017 | Zhu ..................... G09G 3/3233 |
| 2018/0083078 A1* | 3/2018 | Park .................... H01L 27/3248 |

FOREIGN PATENT DOCUMENTS

| | | |
|---|---|---|
| CN | 101650916 A | 2/2010 |
| CN | 102354532 A | 2/2012 |

\* cited by examiner

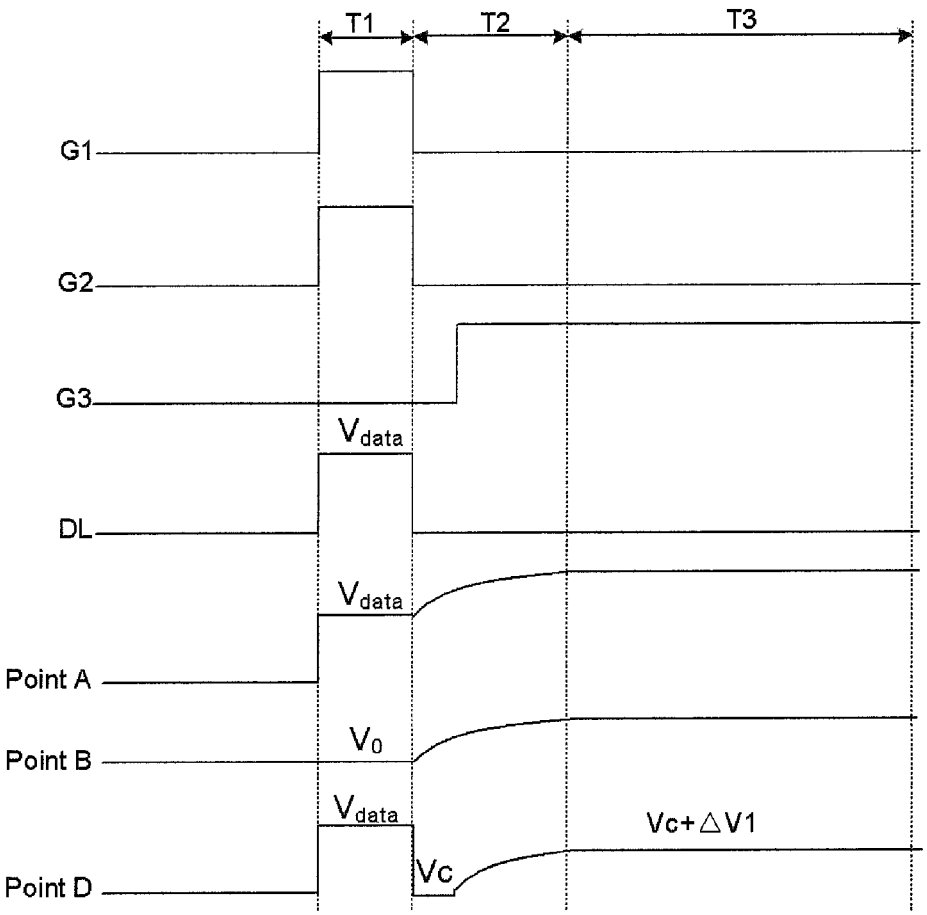

Fig. 10

| In a writing phase For a image frame, a data voltage output from the data line is written by the writing sub-circuit into the driving transistor, and the light emitting sub-circuit is reset by the reset sub-circuit | S10 |

| In a light emitting phase for an image frame, the light emitting sub-circuit is driven by the driving transistor to emit light, and the driving transistor is maintained by the writing sub-circuit to be turned on | S11 |

Fig. 11

PIXEL CIRCUIT, METHOD FOR DRIVING THE SAME, AND DISPLAY APPARATUS

CROSS-REFERENCE TO RELATED APPLICATION(S)

This disclosure claims priority to the Chinese Patent Disclosure 201711213543.1, filed on Nov. 27, 2017, which is incorporated herein by reference in its entirety.

TECHNICAL FIELD

The present disclosure relates to the field of display technology, and more particularly, to a pixel circuit and a method for driving the same, and a display apparatus.

BACKGROUND

Organic Light Emitting Diode (OLED) display is one of the hot spots in the current research field. As oxide Thin Film Transistors (TFTs) have higher mobility, more stable characteristics and better process uniformity, they are used in OLED display apparatuses to form pixel unit circuits.

However, when a negative bias voltage is applied to an oxide TFT, the larger a negative bias voltage of a gate-source voltage ($V_{gs}$), the more a negative shift of a threshold voltage ($V_{th}$). Therefore, it results in electric leakage in the oxide TFT acting as a switch in a light emitting phase, thereby causing a display panel not to display normally.

SUMMARY

According to an aspect of the embodiments of the present disclosure, there is provided a pixel circuit, comprising:

a driving sub-circuit comprising a driving transistor and a first storage capacitor, wherein the first storage capacitor has a first terminal electrically coupled to a gate of the driving transistor, and a second terminal coupled to a second electrode of the driving transistor;

a writing sub-circuit coupled to a scanning signal line for supplying a scanning signal, a data line for supplying a data signal, and the gate of the driving transistor, and configured to write a data voltage output from the data line into the driving transistor and maintain the driving transistor to be turned on, under the control of the scanning signal;

a reset sub-circuit coupled to a reset signal line for supplying a reset signal and a light emitting sub-circuit, and configured to supply an initial voltage from the reset sub-circuit to the light emitting sub-circuit under the control of the reset signal, so as to reset the light emitting sub-circuit; and the light emitting sub-circuit coupled to the driving sub-circuit so as to be driven by the driving sub-circuit to emit light.

In an example, the writing sub-circuit comprises a first transistor and a second transistor, wherein the first transistor has a gate electrically coupled to the scanning signal line, a first electrode electrically coupled to the data line, and a second electrode electrically coupled to a first electrode of the second transistor; and the second transistor has a gate electrically coupled to the first scanning signal line, and a second electrode electrically coupled to the gate of the driving transistor, wherein both the first transistor and the second transistor are N-type etching stopper oxide Thin Film Transistors.

In an example, the writing sub-circuit further comprises a third transistor and a second storage capacitor, wherein the third transistor has a gate electrically coupled to the control signal line, a first electrode electrically coupled to a first terminal of the second storage capacitor, and a second electrode electrically coupled to the second electrode of the first transistor; and the second storage capacitor has a second terminal electrically coupled to the second electrode of the driving transistor.

In an example, the reset sub-circuit comprises a fourth transistor, wherein the fourth transistor has a gate electrically coupled to the reset signal line, a first electrode configured to receive the initial voltage, and a second electrode electrically coupled to the light emitting sub-circuit.

In an example, the first electrode of the fourth transistor is electrically coupled to an initial voltage terminal.

In an example, the first electrode of the fourth transistor is electrically coupled to a sensing signal line for supplying the initial voltage.

In an example, the light emitting sub-circuit comprises a light emitting device, wherein the light emitting device has a first terminal electrically coupled to the second electrode of the driving transistor, and a second electrode electrically coupled to a second power supply voltage terminal.

In an example, the first electrode of the driving transistor is coupled to a first power supply voltage terminal.

According to another aspect of the embodiments of the present disclosure, there is provided a display apparatus comprising a plurality of pixels each of which comprises at least three sub-pixels, wherein each of the sub-pixels comprises the pixel circuit according to the embodiments of the present disclosure.

According to yet another aspect of the embodiments of the present disclosure, there is provided a method for driving the pixel circuit according to the embodiments of the present disclosure, comprising:

writing by the writing sub-circuit, a data voltage output from the data line into the driving transistor, and resetting, by the reset sub-circuit, the light emitting sub-circuit, in a writing phase for an image frame; and driving, by the driving transistor, the light emitting sub-circuit to emit light, and maintaining, by the writing sub-circuit, the driving transistor to be turned on, in a light emitting phase for the image frame.

BRIEF DESCRIPTION OF THE DRAWINGS

In order to more clearly describe the technical solutions according to the embodiments of the present disclosure, the accompanying drawings needed to be used in the description of the embodiments will be briefly described below. Obviously, the accompanying drawings in the following description are merely some embodiments of the present disclosure. Other accompanying drawings can also be obtained by those of ordinary skill in the art based on these accompanying drawings without any creative work.

FIG. 10 is another signal timing diagram of driving a pixel circuit according to the present disclosure; and FIG. 11 is a flowchart of a method for driving a pixel circuit according to the present disclosure.

DETAILED DESCRIPTION

The technical solutions in the embodiments of the present disclosure will be described clearly and fully below with reference to the accompanying drawings in the embodiments of the present disclosure. Obviously, the described embodiments are merely some embodiments of the present disclosure instead of all the embodiments. All other embodiments obtained by those of ordinary skill in the art based on the embodiments of the present disclosure without any creative effort shall fall within the protection scope of the present disclosure.

Figure 1A:
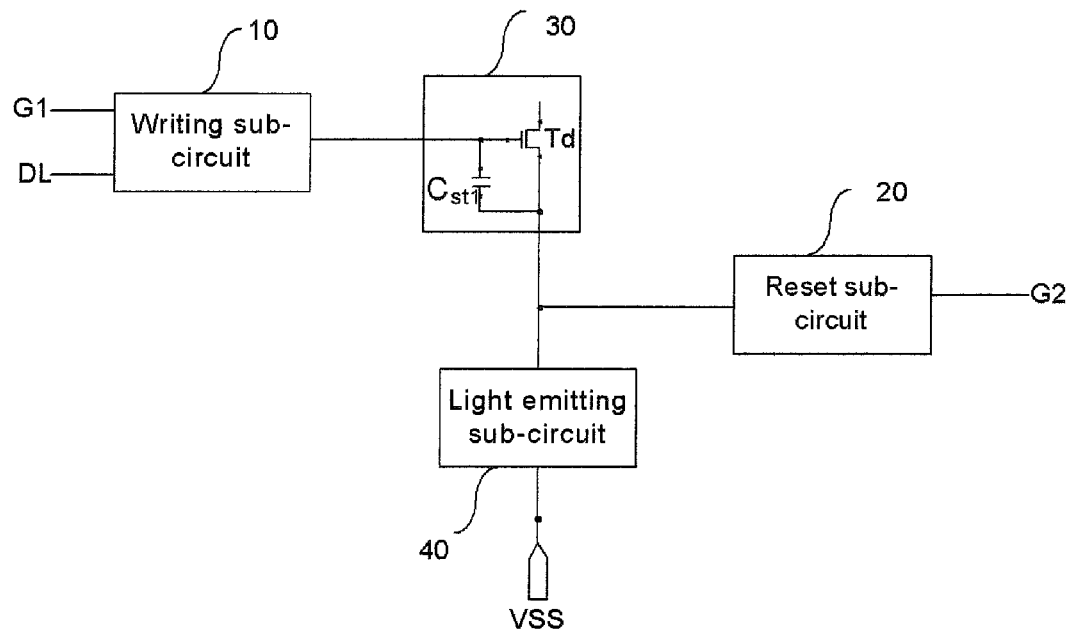
FIG. 1(a) is an exemplary structural diagram of a pixel circuit according to the present disclosure.

As shown in FIG. 1(a), the embodiments of the present disclosure provide a pixel circuit, which may comprise a writing sub-circuit 10, a reset sub-circuit 20, a driving sub-circuit 30, and a light emitting sub-circuit 40. The driving sub-circuit 30 comprises a driving transistor Td and a first storage capacitor $C_{st1}$. The first storage capacitor $C_{st1}$ has a first terminal electrically coupled to a gate of the driving transistor Td, and a second terminal electrically coupled to a second electrode of the driving transistor Td.

The writing sub-circuit 10 is coupled to a scanning signal line G1 for supplying a scanning signal g1, a data line DL for supplying a data signal data, and the gate of the driving transistor Td, respectively, and is configured to write a data voltage data output from the data line DL into the driving transistor Td and maintain the driving transistor Td to be turned on, under the control of the scanning signal g1.

The reset sub-circuit 20 is coupled to a reset signal line G2 for supplying a reset signal g2 and a light emitting sub-circuit 40, and is configured to supply an initial voltage from the reset sub-circuit 20 to the light emitting sub-circuit 40 under the control of the reset signal g2, so as to reset the light emitting sub-circuit 40.

The driving transistor Td is further coupled to the light emitting sub-circuit 40 and is configured to drive the light emitting sub-circuit 40 to emit light.

A gate-source voltage ($V_{gs}$) of the driving transistor Td plays a decisive role in whether to turn on the driving transistor Td. If electric leakage occurs in a gate voltage of the driving transistor Td, $V_{gs}$ of the driving transistor Td may decrease. When $V_{gs}$ decreases to a certain value, the driving transistor Td is turned off.

Therefore, it needs to ensure that a turn-on channel between the gate of the driving transistor Td and the data line DL is fully turned off. When an oxide TFT is used to form a circuit of the writing sub-circuit 10, if a large negative bias is applied to the oxide TFT, a negative shift of $V_{th}$ occurs. Thereby, the TFT may not be turned off fully. Therefore, in the embodiments of the present disclosure, the writing sub-circuit 10 is designed to have electric leakage of the gate voltage of the driving transistor Td in a light emitting phase.

It can be understood by those skilled in the art that how to couple the first electrode of the driving transistor Td is not limited here, as long as the driving transistor Td can drive the light emitting sub-circuit 40 to emit light.

The embodiments of the present disclosure provide a pixel circuit, in which a data voltage is written into the driving transistor Td by the writing sub-circuit 10 in a writing phase, the light emitting sub-circuit 40 is reset by the reset sub-circuit 20, and the light emitting sub-circuit 40 may be driven by the driving transistor Td to emit light in the light emitting phase. As the driving transistor Td is maintained by the writing sub-circuit 10 to be turned on in the light emitting phase, that is, electric leakage of the gate voltage of the driving transistor Td does not occur from the writing sub-circuit 10, the light emitting sub-circuit 40 may continue to emit light normally in the light emitting phase. Thereby, when the pixel circuit is applied to a display apparatus, the display apparatus can display normally.

Figure 1B:
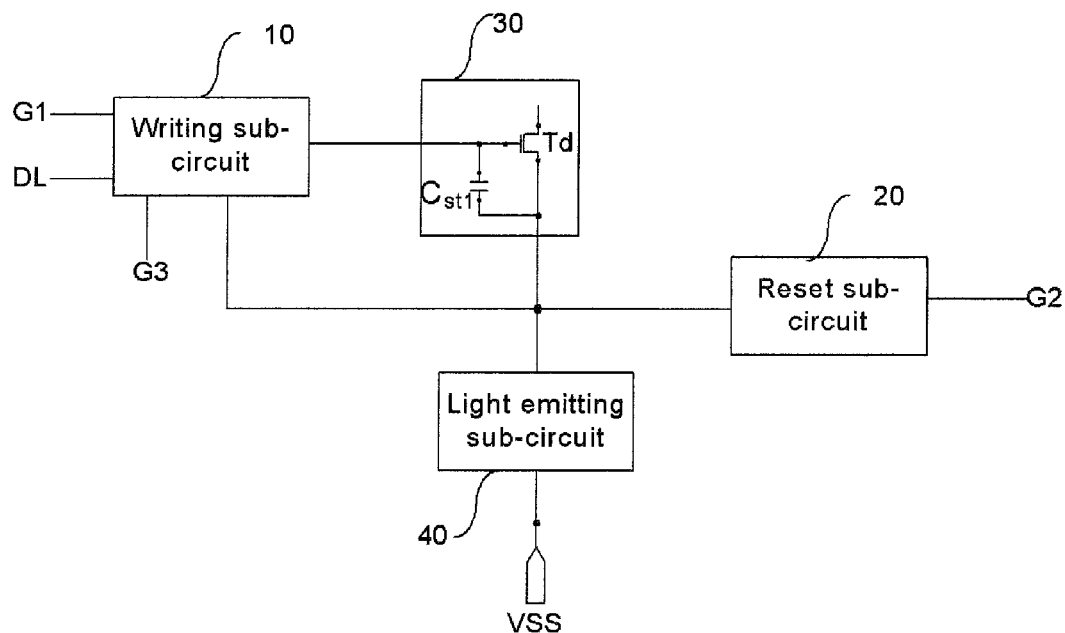
FIG. 1(b) is an exemplary structural diagram of a pixel circuit according to the present disclosure.

As shown in FIG. 1(b), the writing sub-circuit 10 may further be coupled to a control signal line G3 for supplying a control signal g3 and the second electrode of the driving transistor Td.

The problem of electric leakage of the gate of the driving transistor Td will be described below using an exemplary pixel circuit.

Figure 2:
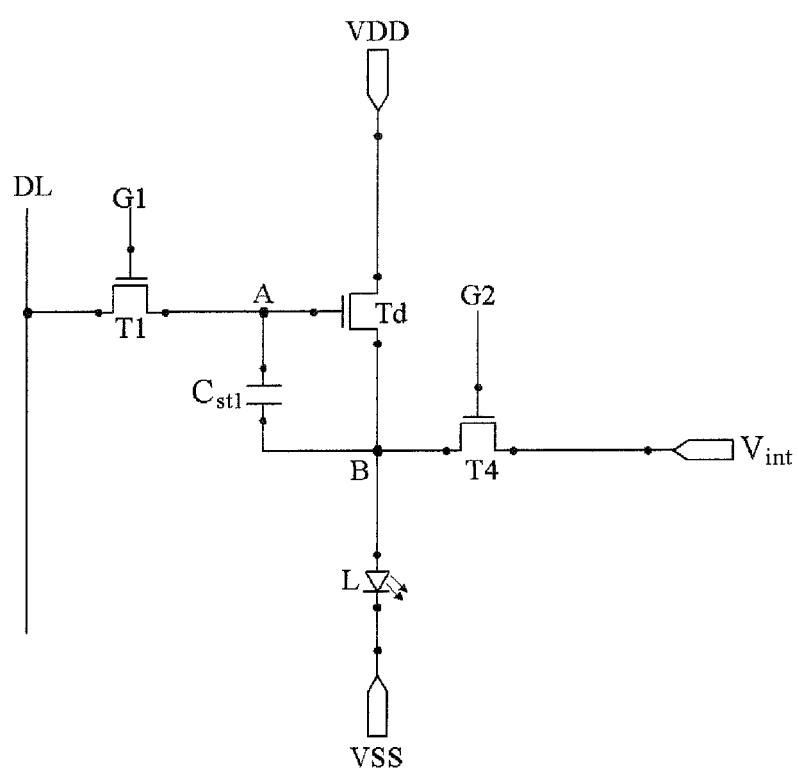
FIG. 2 is a diagram of a pixel circuit in which electric leakage occurs in a gate of a driving transistor according to the present disclosure.

As shown in FIG. 2, a first transistor T1 has a gate electrically coupled to the scanning signal line G1, a first electrode electrically coupled to the data line DL, and a second electrode electrically coupled to the gate of the driving transistor Td. Both of the first transistor T1 and the driving transistor Td are N-type transistors, and the first transistor T1 is an oxide TFT. A fourth transistor T4 has a gate electrically coupled to the reset signal line G2, a first electrode electrically coupled to an initial voltage terminal $V_{int}$, and a second electrode electrically coupled to the second electrode of the driving transistor Td. Based on the pixel circuit, in a writing phase, a scanning signal is input to the scanning signal line G1, the first transistor T1 is turned on, and a data voltage output from the data line DL is written into the driving transistor Td, that is, the data voltage, denoted as $V_{data}$, is written at point A. At the same time, a scanning signal is input to the reset signal line G2, and an initial voltage is provided by the initial voltage terminal $V_{int}$ to the light emitting sub-circuit 40, i.e., the initial voltage, denoted as $V_0$, is written at point B.

In a light emitting phase, a low level signal is input to the scanning signal line G1 and the reset signal line G2. The driving transistor Td is turned on and charging starts at the point B. Under the action of the capacitor bootstrap, a voltage at the point A rises with a voltage at the point B. Finally, the voltage at the point A is $V_{data}+\Delta V$, the voltage at the point B is $V_0+\Delta V$, and $\Delta V$ is a voltage across a light emitting device in the light emitting sub-circuit 40.

In the light emitting phase, a gate voltage of the first transistor T1 is denoted as $V_{g1}$. In a case that the voltage at the point A is $V_{data}+\Delta V$, $V_{gs}$ of the first transistor T1 is equal to $V_{g1}-(V_{data}+\Delta V)$. $V_{g1}$ is typically −5V, ΔV of the OLED is currently about 8V, and $V_{gs}$ is large at this time. If $V_{data}$ is 8V, $V_{gs}$ is theoretically −21V. However, in consideration of aging, grayscale loss, etc. of the OLED, $V_{gs}$ is about −24V. Therefore, a large bias voltage is applied to the first transistor T1 for a long time. This results in a negative shift of $V_{th}$ of the first transistor T1, thereby causing the first transistor T1 not to be turned off fully under the voltage of $V_{g1}$. This causes electric leakage of the point A through the first transistor T1, which in turn reduces $V_{gs}$ of the driving transistor Td. The driving transistor Td is turned off until $V_{gs}$ is reduced to a certain value. When $V_{th}<V_{g1}-V_{data}$, that is, when $V_{th}$ is negatively shifted to be lower than −5V, electric leakage occurs in the first transistor T1.

Based thereon, the embodiments of the present disclosure provide a circuit structure of the writing sub-circuit 10 of the exemplary pixel circuit to improve the problem of the electric leakage of the gate of the driving transistor Td.

Figure 3:
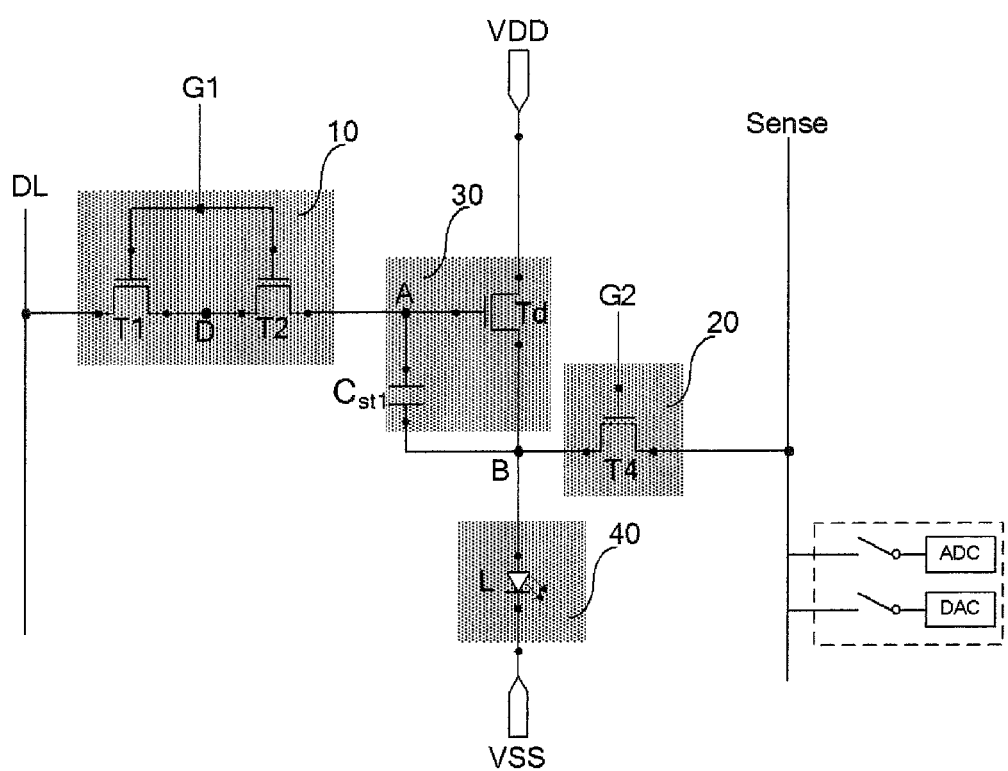
FIG. 3 is an exemplary structural diagram of various sub-circuits of the pixel circuit shown in FIG. 1(a)

As shown in FIG. 3, according to the embodiments of the present disclosure, the first electrode of the driving transistor Td is coupled to a first power supply voltage terminal VDD. The writing sub-circuit 10 may comprise a first transistor T1 and a second transistor T2. The first transistor T1 has a gate electrically coupled to the scanning signal line G1, a first electrode electrically coupled to the data line DL, and a second electrode electrically coupled to a first electrode of the second transistor T2. The second transistor T2 has a gate electrically coupled to the scanning signal line G1, and a second electrode electrically coupled to the gate of the driving transistor Td. Both of the first transistor T1 and the second transistor T2 are N-type etching stopper oxide TFTs, and the driving transistor Td is also an N-type TFT.

Figure 5:
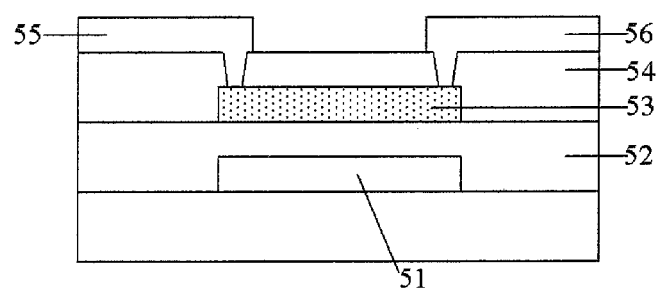
FIG. 5 is a structural diagram of an etching stopper oxide TFT according to the present disclosure.

As shown in FIG. 5, the etching stopper oxide TFT may comprise a gate 51, a gate insulating layer 52, an oxide active layer 53, an etching stopper layer 54, and a source 55 and a drain 56 disposed above the etching stopper layer 54, which are disposed in sequence. The source 55 and the drain 56 are in contact with the oxide active layer 53 through vias on the etching stopper layer 54.

As shown in FIG. 3, the reset sub-circuit 20 may comprise a fourth transistor T4, wherein the fourth transistor T4 has a gate electrically coupled to the reset signal line G2, a first electrode configured to receive an initial voltage, and a second electrode electrically coupled to the light emitting sub-circuit 40. The fourth transistor T4 may be an N-type or P-type TFT, and the embodiment of the present disclosure is described by taking the fourth transistor T4 being an N-type transistor as an example.

Figure 4:
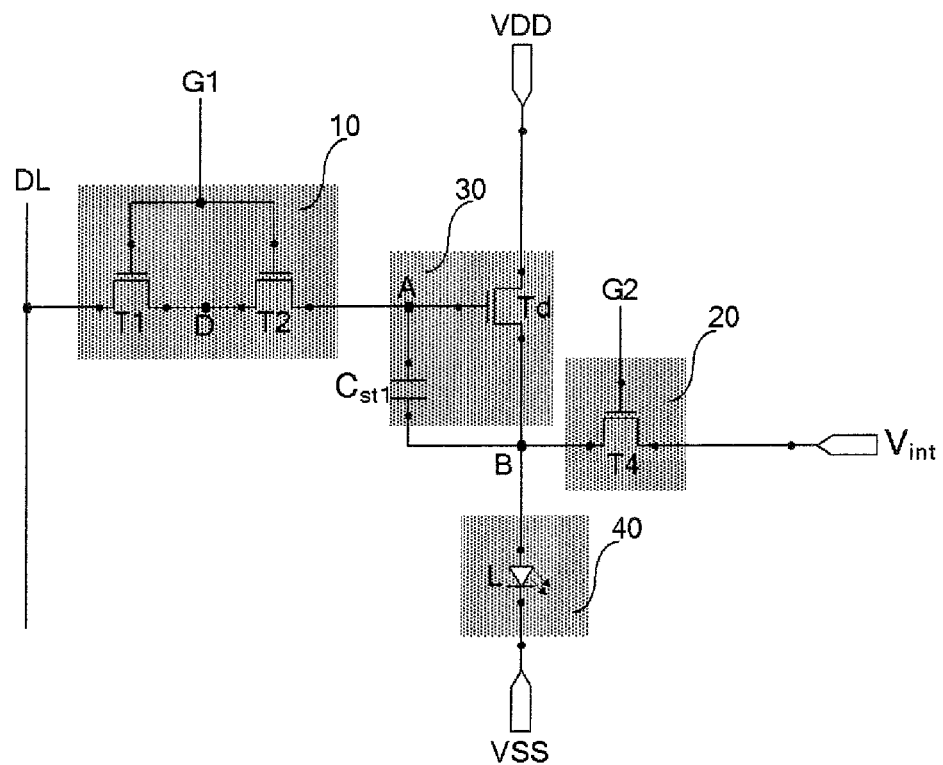
FIG. 4 is another structural diagram of various sub-circuits of the pixel circuit shown in FIG. 1(a)

It should be illustrated that the first electrode of the fourth transistor T4 may be electrically coupled to the initial voltage terminal $V_{int}$ (as shown in FIG. 4). In this case, the scanning signal line G1 and the reset signal line G2 may be the same signal line. That is, the scanning signal may be used as a reset signal. It can be understood that the fourth transistor T4 is also an N-type transistor.

The first electrode of the fourth transistor T4 may further be electrically coupled to a sensing signal line Sense, and the initial voltage is provided by the sensing signal line Sense (as shown in FIG. 3). In this case, the first scanning signal line G1 and the reset signal line G2 may be different signal lines.

When the first electrode of the fourth transistor T4 is electrically coupled to the sensing signal line Sense, the sensing signal line Sense may be coupled to a Digital-to-Analog Converter (DAC) and an Analog-to-Digital Converter (ADC) through switches, respectively. In a writing phase, the DAC is coupled to the sensing signal line Sense, and the initial voltage is provided by the DAC to the sensing signal line Sense, so as to be input to the first electrode of the fourth transistor T4. Thereby, the light emitting sub-circuit 40 is reset, to ensure that the light emitting sub-circuit 40 does not emit light. In addition, the ADC may further be coupled to the sensing signal line Sense, and the ADC may sense parameters of the driving transistor Td through the sensing signal line Sense and the fourth transistor T4 which is turned on to compensate for the driving transistor Td externally.

It should be illustrated that a switch coupled to the sensing signal line Sense and the DAC and the ADC coupled through the switch do not belong to the pixel circuit, and these components may be, for example, provided on a circuit board of a display apparatus or integrated in an IC.

The light emitting sub-circuit 40 comprises a light emitting device L. The light emitting device L has a first electrode (for example, an anode) electrically coupled to the second electrode of the driving transistor Td, and a first electrode (for example, a cathode) electrically coupled to a second power supply voltage terminal VSS. The light emitting device L may be an OLED.

Figure 6:
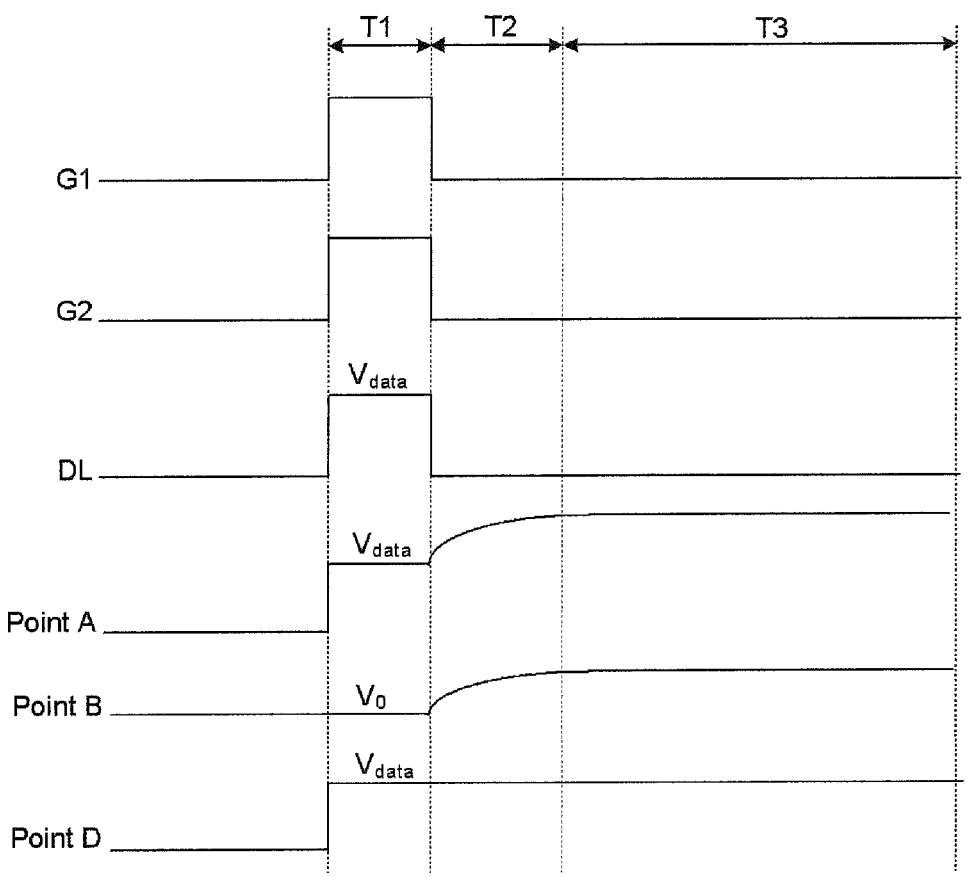
FIG. 6 is a signal timing diagram of driving a pixel circuit according to the present disclosure.

FIG. 6 illustrates a signal timing diagram of the pixel circuit shown in FIG. 4. An operation of the pixel circuit according to the embodiment of the present disclosure will be described below in conjunction with FIGS. 4 and 6.

As shown in FIG. 6, in a first phase T1, a scanning signal is input to the scanning signal line G1 and the reset signal line G2, the first transistor T1 and the second transistor T2 are turned on, and a data voltage output from the data line DL is written into the driving transistor Td, i.e., the data voltage, denoted as $V_{data}$, is written at point A. A potential at a corresponding point D is also $V_{data}$. An initial voltage $V_0$ is provided to the light emitting device L, i.e., $V_0$ is written at point B.

In a bootstrap phase T2, a turn-off signal is input to the scanning signal line G1 and the reset signal line G2. As both of the first transistor T1 and the second transistor T2 are etching stopper oxide TFTs, there are $C_{gs}$ (gate-source parasitic capacitance) and $C_{gd}$ (gate-drain parasitic capacitance) at the point D, and therefore the voltage at the point D continues to be maintained at $V_{data}$. As the driving transistor Td is turned on, the first power supply voltage terminal VDD starts charging the point B, and the potential at the point A also rises therewith under the action of the capacitor bootstrap.

In a light emitting phase T3, the voltage at the point A is $V_{data}+\Delta V$, and the voltage at the point B is $V_0+\Delta V$. For the first transistor T1, $V_{gs}$ of the first transistor T1 is equal to $V_{g1}-V_{data}<V_{g1}-(V_{data}+\Delta V)$, which is negatively biased less than the first transistor T1 in the pixel circuit shown in FIG. 2. Therefore, the pixel circuit according to the embodiment of the present disclosure reduces the influence of the bias voltage applied to the first transistor T1, and amplitude of a negative shift of $V_{th}$ of the first transistor T1 also decreases therewith. For the second transistor T2, $V_{gs}$ of the second transistor T2 is equal to $V_{g1}-(V_{data}+\Delta V)$, but $V_{ds}=V_{data}+\Delta V-V_{data}=\Delta V$. Although $V_{gs}$ of the second transistor T2 is large, $V_{ds}$ of the second transistor T2 is small, which also mitigates the influence of the bias voltage applied to the second transistor T2 on $V_{th}$. Based thereon, as both of the first transistor T1 and the second transistor T2 reduce the influences on $V_{th}$, the problem of the electric leakage of the gate of the driving transistor Td can be effectively improved, thereby improving a situation in which a picture disorder occurs due to reduction in display brightness.

It should be illustrated that the bootstrap phase T2 is very short and may be seen as an early phase of the light emitting phase T3.

Figure 7:
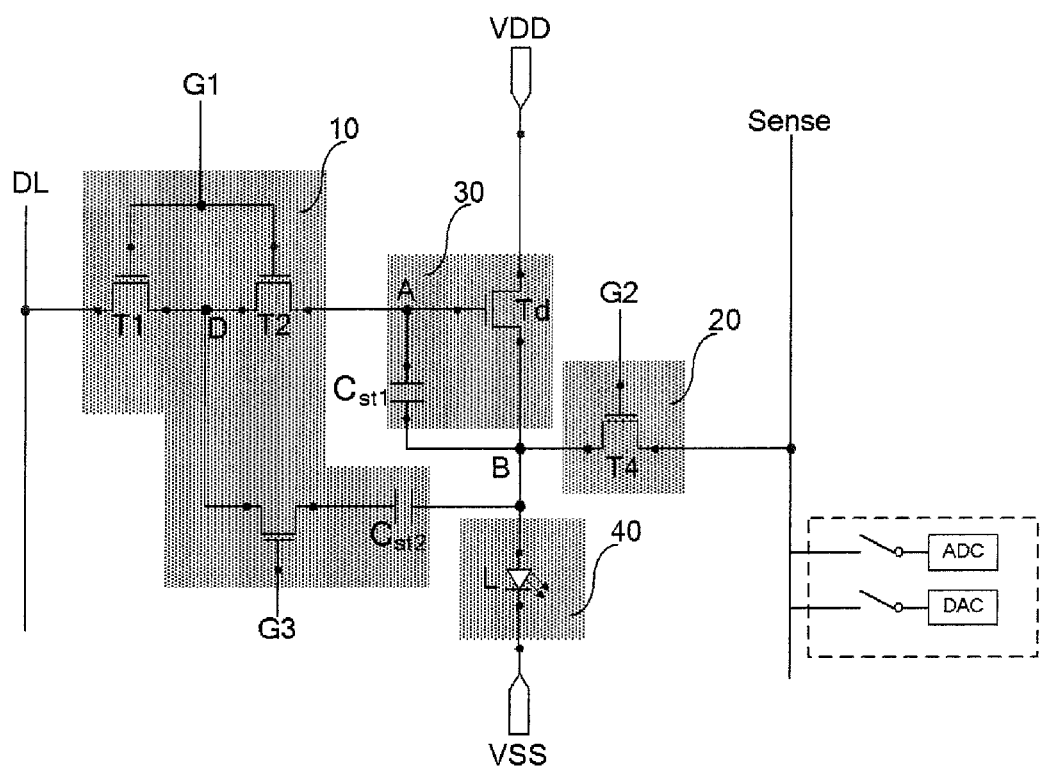
FIG. 7 is a structural diagram of various sub-circuits of the pixel circuit shown in FIG. 1(b)
Figure 8:
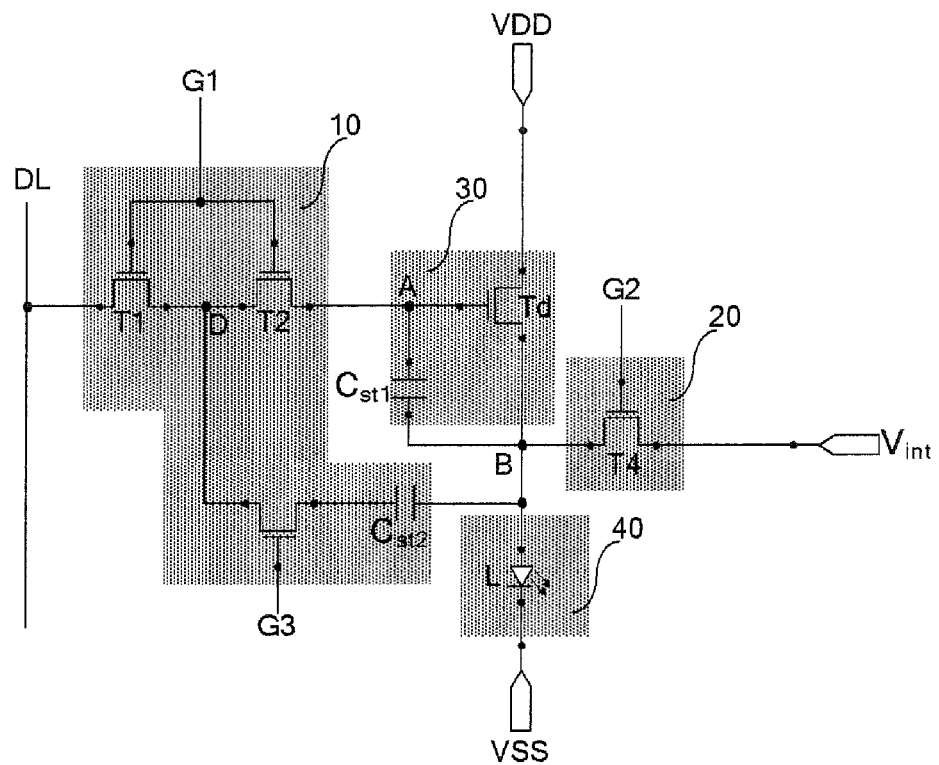
FIG. 8 is another structural diagram of various sub-circuits of the pixel circuit shown in FIG. 1(b)

FIGS. 7 and 8 illustrate schematic circuit diagrams of a pixel circuit according to another embodiment of the present disclosure respectively. As shown in FIGS. 7 and 8, the driving transistor Td has a first electrode coupled to a first power supply voltage terminal VDD. The writing sub-circuit 10 may comprise a first transistor T1, a second transistor T2, a third transistor T3, and a second storage capacitor $C_{st2}$. The first transistor T1 has a gate electrically coupled to a scanning signal line G1, a first electrode electrically coupled to a data line DL, and a second electrode electrically coupled to a first electrode of the second transistor T2. The second transistor T2 has a gate electrically coupled to the scanning signal line G1, and a second electrode electrically coupled to the gate of the driving transistor Td. The third transistor T3 has a gate electrically coupled to a control signal line G3, a first electrode electrically coupled to a first terminal of the second storage capacitor $C_{st2}$, and a second electrode electrically coupled to the second electrode of the first transistor T1. A second terminal of the second storage capacitor $C_{st2}$ is electrically coupled to the second electrode of the driving transistor Td. Both of the first transistor T1 and the second transistor T2 are N-type top-gate oxide TFTs, and the driving transistor Td is also an N-type TFT. The third transistor T3 may be an N-type or P-type TFT, and the embodiment of the present disclosure is described by taking the third transistor T3 being an N-type transistor as an example.

Figure 9:
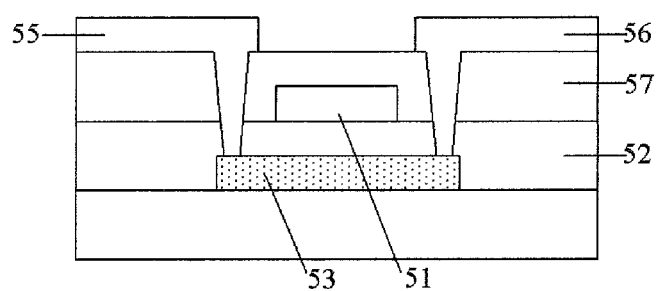
FIG. 9 is a structural diagram of a top-gate oxide TFT according to the present disclosure.

It can be understood that, as shown in FIG. 9, the top-gate oxide TFT comprises an oxide active layer 53, a gate insulating layer 52, a gate 51, an interlayer insulating layer 57, and a source 55 and a drain 56 disposed above the interlayer insulating layer 47, which are disposed in sequence. The source 55 and the drain 56 are in contact with the oxide active layer 53 through vias on the interlayer insulating layer 57 and the gate insulating layer 52.

As an overlapped area of the source 55 and the drain 56 with the oxide active layer 53 is very small, parasitic capacitance of the top-gate oxide TFT is negligible.

The reset sub-circuit 20 may comprise a fourth transistor T4. The fourth transistor T4 has a gate electrically coupled to a reset signal line G2, a first electrode configured to receive an initial voltage, and a second electrode electrically coupled to a light emitting sub-circuit 40. The fourth transistor T4 may be an N-type or P-type TFT, and the embodiment of the present disclosure is described by taking the fourth transistor T4 being an N-type transistor as an example.

It should be illustrated that the first electrode of the fourth transistor T4 may be electrically coupled to an initial voltage terminal $V_{int}$ (as shown in FIG. 8). In this case, the scanning signal line G1 and the reset signal line G2 may be the same signal line. It can be understood that the fourth transistor T4 is also an N-type transistor at this time.

The first electrode of the fourth transistor T4 may further be electrically coupled to a sensing signal line Sense, and the initial voltage is provided by the sensing signal line Sense (as shown in FIG. 7). In this case, the scanning signal line G1 and the reset signal line G2 may be different signal lines.

When the first electrode of the fourth transistor T4 is electrically coupled to the sensing signal line Sense, the sensing signal line Sense may be coupled to a DAC and an ADC through switches, respectively. In a writing phase, the DAC is firstly coupled to the sensing signal line Sense, and the initial voltage is provided by the DAC to the sensing signal line Sense, so as to be input to the first electrode of the fourth transistor T4. Thereby, the light emitting sub-circuit 40 is reset, to ensure that the light emitting sub-circuit 40 does not emit light. In addition, the ADC may further be coupled to the sensing signal line Sense, and the ADC may sense parameters of the driving transistor Td through the sensing signal line Sense and the fourth transistor T4 which is turned on to compensate for the driving transistor Td externally.

The light emitting sub-circuit 40 comprises a light emitting device L. The light emitting device L has a first electrode (for example, an anode) electrically coupled to the second electrode of the driving transistor Td, and a second electrode (for example, a cathode) electrically coupled to a second power supply voltage terminal VSS.

FIG. 10 illustrates a signal timing diagram of the pixel circuits of the embodiments in FIGS. 7 and 8. An operation of the pixel circuits according to the embodiments of the present disclosure will be described below with reference to FIGS. 7, 8, and 10.

As shown in FIG. 10, in a writing phase T1, a high level scanning signal is input to the scanning signal line G1 and the reset signal line G2 at the same time, a low level signal is input to the control signal line G3, the first transistor T1 and the second transistor T2 are turned on, a data voltage output from the data line DL is written into the driving transistor Td, i.e., the data voltage, denoted as $V_{data}$, is input at point A, and a potential at a corresponding point D is also $V_{data}$. At the same time, an initial voltage $V_0$ is provided to the light emitting device L, i.e., $V_0$ is written at point B.

In a first phase of a bootstrap phase T2, a low level signal is input to the scanning signal line G1 and the reset signal line G2. As both of the first transistor T1 and the second transistor T2 are top-gate oxide TFTs, $C_{gs}$ and $C_{gd}$ are very small, which results in that the voltage at the point D, denoted as $V_c$, cannot be maintained and is very small. At the point B, as the driving transistor Td is turned on, the first power supply voltage terminal VDD starts charging the point B, and the potential at the point A also rises therewith under the action of the capacitor bootstrap.

In a second phase of the bootstrap phase T2, a high level signal is input to the control signal line G3, the third transistor T3 is turned on, and the point B continues to bootstrap, to raise the voltage at the point D to $Vc+\Delta V1$ through the second storage capacitor $C_{st2}$.

In a light emitting phase, the voltage at the point A is $V_{data}+\Delta V$, the voltage at the point B is $V_0+\Delta V$, and the voltage at the point D is $Vc+\Delta V1$. $V_{gs}$ of the first transistor T1 is equal to $V_{g1}-(Vc+\Delta V1)<V_{g1}-(V_{data}+\Delta V)$, which is negatively biased less than the first transistor T1 in the pixel circuit shown in FIG. 2. Therefore, in the embodiment of the present disclosure, the influence of the bias voltage applied to the first transistor T1 is reduced, and magnitude of a negative shift of $V_{th}$ of the first transistor T1 also decreases therewith. $V_{gs}$ of the second transistor T2 is equal to $V_{g1}-(V_{data}+\Delta V)$, but $V_{ds}$ of the second transistor T2 is equal to $V_{data}+\Delta V-(Vc+\Delta V1)=\Delta V$. Although $V_{gs}$ of the second transistor T2 is large, $V_{ds}$ of the second transistor T2 is small, which mitigates the influence of the bias voltage applied to the second transistor T2 on $V_{th}$. Based thereon, as both of the first transistor T1 and the second transistor T2 reduce the influences on $V_{th}$, the problem of the electric leakage of the gate of the driving transistor Td can be effectively improved, thereby improving a situation in which a picture disorder occurs due to reduction in display brightness.

The embodiments of the present disclosure further provide a display apparatus comprising a plurality of pixels, each of which comprises at least three sub-pixels, wherein each of the sub-pixels comprises the pixel circuit described above.

Each pixel may comprise three sub-pixels, or there may be a white sub-pixel in addition to the three sub-pixels, that is, each pixel comprises four sub-pixels.

It can be understood that in one row of pixels, all the writing sub-circuits 10 may be coupled to one scanning signal line, and when there is a control signal line included, all the writing sub-circuits 10 may be coupled to one control signal line. In one row of pixels, all the reset sub-circuits 20 may be coupled to one reset signal line. In one column of pixels, all the writing sub-circuits 10 are coupled to one data line DL.

The embodiments of the present disclosure further provide a method for driving the pixel circuit described above. As shown in FIG. 11, the driving method may comprise the following steps.

In S10, in a writing phase for an image frame, a data voltage output from the data line DL is written by the writing sub-circuit 10 into the driving transistor Td, and the light emitting sub-circuit 40 is reset by the reset sub-circuit 20.

In S11, in a light emitting phase for the image frame, the light emitting sub-circuit 40 is driven by the driving transistor Td to emit light, and the driving transistor Td is maintained by the writing sub-circuit 10 to be turned on.

The foregoing description is merely specific implementations of the present disclosure, and the protection scope of the present disclosure is not limited thereto. Variations or substitutions which can be easily reached by any skilled in the art within the technical scope disclosed by the present disclosure should be within the protection scope of the present disclosure. Therefore, the protection scope of the present disclosure should be based on the protection scope of the claims.

We claim:

1. A pixel circuit, comprising:
a driving sub-circuit comprising a driving transistor and a first storage capacitor, wherein the first storage capacitor has a first terminal electrically coupled to a gate of the driving transistor, and a second terminal coupled to a second electrode of the driving transistor;
a writing sub-circuit coupled to a scanning signal line for supplying a scanning signal, a data line for supplying a data signal, and the gate of the driving transistor, and configured to write a data voltage output from the data line into the driving transistor and maintain the driving transistor to be turned on, under a control of the scanning signal;
a reset sub-circuit coupled to a reset signal line for supplying a reset signal and a light emitting sub-circuit, and configured to supply an initial voltage from the reset sub-circuit to the light emitting sub-circuit under a control of the reset signal, so as to reset the light emitting sub-circuit; and
the light emitting sub-circuit coupled to the driving sub-circuit so as to be driven by the driving sub-circuit to emit light;
wherein the writing sub-circuit further comprises:
a first transistor, the first transistor has a gate electrically coupled to the scanning signal line, a first electrode electrically coupled to the data line, and a second electrode electrically coupled to a first electrode of the second transistor;
a second transistor, the second transistor has a gate electrically coupled to the scanning signal line, and a second electrode electrically coupled to the gate of the driving transistor,
a third transistor, the third transistor has a gate electrically coupled to a control signal line, a first electrode electrically coupled to a first terminal of the second storage capacitor, and a second electrode electrically coupled to the second electrode of the first transistor; and
a second storage capacitor, the second storage capacitor has a second terminal electrically coupled to the second electrode of the driving transistor;
wherein both the first transistor and the second transistor are N-type etching stopper oxide Thin Film Transistors.

2. The pixel circuit according to claim 1, wherein the reset sub-circuit comprises a fourth transistor, wherein
the fourth transistor has a gate electrically coupled to the reset signal line, a first electrode configured to receive the initial voltage, and a second electrode electrically coupled to the light emitting sub-circuit.

3. The pixel circuit according to claim 2, wherein the first electrode of the fourth transistor is electrically coupled to an initial voltage terminal.

4. The pixel circuit according to claim 2, wherein the first electrode of the fourth transistor is electrically coupled to a sensing signal line for supplying the initial voltage.

5. The pixel circuit according to claim 1, wherein the light emitting sub-circuit comprises a light emitting device, wherein
the light emitting device has a first terminal electrically coupled to the second electrode of the driving transistor, and a second electrode electrically coupled to a second power supply voltage terminal.

6. The pixel circuit according to claim 1, wherein the first electrode of the driving transistor is coupled to a first power supply voltage terminal.

7. A display apparatus comprising a plurality of pixels each of which comprises at least three sub-pixels, wherein each of the sub-pixels comprises the pixel circuit according to claim 1.

8. A method for driving the pixel circuit according to claim 1, comprising:
writing by the writing sub-circuit, a data voltage output from the data line into the driving transistor, and resetting, by the reset sub-circuit, the light emitting sub-circuit, in a writing phase for an image frame; and
driving, by the driving transistor, the light emitting sub-circuit to emit light, and maintaining, by the writing sub-circuit, the driving transistor to be turned on, in a light emitting phase for the image frame.

* * * * *